United States Patent [19]

Larson et al.

[11] Patent Number: 5,485,671

[45] Date of Patent: Jan. 23, 1996

[54] METHOD OF MAKING A TWO-PHASE THERMAL BAG COMPONENT COOLER

[75] Inventors: Ralph I. Larson, Bolton, Mass.; Richard J. Phillips, Alachua, Fla.

[73] Assignee: Aavid Laboratories, Inc., S. Lancaster, Mass.

[21] Appl. No.: 215,541

[22] Filed: Mar. 22, 1994

Related U.S. Application Data

[63] Continuation-in-part of Ser. No. 120,153, Sep. 10, 1993.

[51] Int. Cl.⁶ ..................................................... B23P 15/00
[52] U.S. Cl. ................. 29/840.032; 165/104.19; 165/104.33
[58] Field of Search ................. 165/46, 104.33, 165/104.19; 29/890.032

[56] References Cited

U.S. PATENT DOCUMENTS 3,741,292  6/1973  Askalu et al. .
4,997,032  3/1991  Danielson et al. .......................... 165/46
5,000,256  3/1991  Tousignant ................................. 165/46

*Primary Examiner*—Irene Cuda
*Attorney, Agent, or Firm*—Bookstein & Kudirka

[57] ABSTRACT

A two-phase liquid cooling system for an electronic component comprised of flexible sealed bag which is partially filled with a liquid coolant. Sufficient residual non-condensing gas is maintained in the bag so that some of the gas dissolves in the liquid coolant when the device is not operating and at ambient temperature. During warmup, the residual gas comes out of solution and creates nucleation sites that assist in initiating boiling. The bag is air and fluid-impermeable, and has sufficient flexibility such that as coolant vaporizes, the bag expands to maintain the internal bag pressure substantially the same as the ambient environmental pressure. The bag may also be provided with a metal heat spreader plate which passes through a wall of the bag an assists with transferring heat from the component to the coolant. The heat spreader plate may be specially treated to allow the flexible bag material to by directly heat sealed to the plate and to provide nucleation sites to enhance coolant boiling.

7 Claims, 4 Drawing Sheets

METHOD OF MAKING A TWO-PHASE THERMAL BAG COMPONENT COOLER

CROSS-REFERENCE TO RELATED APPLICATION

This application is a continuation-in-part of our application Ser. No. 08/120,153 filed Sep. 10, 1993 entitled "Two-Phase Component Cooler".

FIELD OF THE INVENTION

This invention relates generally to an apparatus for dissipating the heat generated by electronic components, such as integrated circuits, and, in particular, to a flexible bag-like container which contains a coolant in both a liquid phase and vapor phase to provide enhanced heat dissipation.

BACKGROUND OF THE INVENTION

Traditional methods of cooling electronic systems, such as computers, have most commonly involved air as the heat transfer medium within the system. In such systems, heat generated by electronic components is typically transferred to the air surrounding the components and then to an ultimate sink, generally the room in which the electronic system is located. Heat transfer between the components and the surrounding air may be enhanced by increasing the surface area of contact between the electronic components and the air, for example, by using a heat sink, which itself may have fins to further increase the surface area available for heat transfer. Air circulation within the system may occur by natural convection or may be further enhanced by forcing the air to circulate about the components by means of a fan or blower.

As electronic equipment becomes more sophisticated and yet more compact in size, the density of the heat-dissipating components mounted on a particular circuit board has necessarily increased. This is also true of the integrated circuit packages themselves, with the number and density of active devices, such as transistors, within a given package steadily increasing over time.

Unfortunately, these trends of increasing complexity and decreasing size have meant that the amount of heat dissipated within a given volume has also increased. With current-day integrated circuit technologies, the time is fast approaching when conventional air convection cooling methods, even those using forced air circulation with large heat sinks, will not adequately maintain certain high density integrated circuit packages within their permissible operating temperature range.

Consider, for example, the Pentium™ series of microprocessor chips recently introduced by Intel Corporation of Santa Clara, Calif. Depending on its operating speed, a Pentium™ P-5 chip typically dissipates on the order of 15 watts in a package which has less than two square inches of surface area, and a Pentium™ P-6 chip dissipates from 22 to 30 watts. Other microprocessor chips, such as the Alpha™ microprocessor recently introduced by Digital Equipment Corporation of Maynard, Mass. are projected to produce heat dissipations of 25 watts or higher in the same two square inches in their highest speed versions. If conventional air convection cooling techniques are to be used, such chips would require very high air flow rates over finned heat sinks in order to maintain the chips in their desired operating temperature range.

Although such forced air cooling requirements are technically feasible, practical considerations rule out their use in current day personal computer applications. One reason is that the blowers or fans necessary to generate such a high air flow rate would necessarily create an unacceptable noise level in an operating environment such as an office which is expected to remain relatively quiet.

This problem is further exacerbated in applications such as laptop and notebook computers, where the additional noise and weight of a forced air cooling system is simply neither practical nor desired.

Consequently, there has been renewed interest in adapting liquid cooling techniques, which make use of natural convection of a coolant, to the problem of cooling high-powered integrated circuits. These techniques generally fall into two broad groups, including single-phase and two-phase cooling systems. In a single-phase liquid cooling system, the coolant remains in the liquid phase over the normal and expected system operating temperature range. In a two-phase system, the coolant changes from the liquid phase to the vapor phase during at least one point in the normal operating temperature range.

One example of a single-phase liquid cooling system makes use of a hermetic enclosure filled with a high-boiling point liquid coolant which completely encloses the heat generating component. The enclosure may also be provided with external fins. Heat is transferred from the heat dissipating component to the liquid coolant by conduction and from the coolant to the walls of the enclosure by natural convection; the enclosure itself may further be cooled by circulating air around it. Such a cooling method can be effective, but involves other problems such as chemical incompatibilities between the component and the coolant over the long-term, and the difficulty of obtaining access to the component for maintenance.

Other single-phase systems do not directly immerse the integrated circuit component in the liquid, but instead confine just the coolant to a container which is then placed in intimate contact with the component. Heat is thus conducted from the component through the container wall into the liquid, which then dissipates the heat by natural convection.

One embodiment of the latter single-phase system uses a container in the form of a sealed flexible bag which is completely filled with a liquid coolant. The bag is typically constructed from a flexible plastic film which is relatively impermeable to both the air and the enclosed liquid. Metal inserts or thermal vias, which pass through the wall of the bag, may also be used with this type of system to more efficiently conduct the heat from the component to the coolant. Examples of such coolant bag systems are shown in U.S. Pat. Nos. 4,997,032 and 5,000,256 assigned to Minnesota Mining and Manufacturing Company of St. Paul, Minn.

While such single-phase bag systems can be useful in certain situations, they have several disadvantages. Because they use a single-phase coolant, the available heat transfer rate is still relatively low. Consequently, they cannot typically be used with the high heat dissipating electronic components such as microprocessors. In addition, the bags have a relatively large volume which conflicts with the current trend of reducing system size as much as possible, and thus single-phase bag systems have not found widespread practical application.

Two-phase liquid cooling systems have increasingly been used to overcome the limitations associated with single-phase systems. In a two-phase system, as the component heats up, a liquid coolant is vaporized. The vapor then travels to a condenser section of the system, where the coolant vapor is converted back into a liquid. The liquid is returned by some means to the heat dissipating component and the boiling and condensing cycle is continuously repeated.

Such a two-phase device is shown in U.S. Pat. No. 3,741,292 assigned to International Business Machines Corporation of Armonk, N.Y. In that system, the heat dissipating component is placed within a hermetic enclosure and directly immersed in a pool of low boiling point, dielectric liquid coolant. The heat dissipated by the component causes the liquid to boil, and the resulting vapor is collected in an enclosure space located above the liquid pool. The enclosure space is filled with inwardly extending fins which serve as a condenser for the coolant vapor. As the vapor condenses, it runs back into the liquid pool under the influence of gravity.

Other two-phase cooling systems, so called heat pipe systems, do not directly immerse the component into the coolant. Such systems consist of an elongated hermetic container made with thermally conductive walls, for example, from copper. One end of the container acts as an evaporator and the other end acts as a condenser. A wick or other capillary device, such as a fine mesh screen, extends along the interior of the container. During manufacture of the heat pipe, the container is partially filled with low boiling point liquid coolant, and any residual, non condensing gases, such as air, are purged, and the container is then sealed. The heat dissipating component is mounted to the evaporator end of the pipe, and heat is transferred by conduction through the container wall. As the coolant evaporates, or boils, the resulting vapor travels down the container to the other end where it condenses back to a liquid. The liquid is then returned to the evaporator end by means of the wick.

Although the direct immersion and heat pipe techniques can transfer heat away from the heat dissipating component quite efficiently, they also have their limitations. More specifically, both techniques use rigid, hermetically sealed containers. When the ambient temperature changes, the pressure inside the container changes, with a consequent change in the boiling point of the coolant. Thus, the cooling capacity of the system changes when the ambient temperature changes.

In addition, because the container is evacuated, there exists a significant pressure differential along the walls of the container. As the container is exposed to repeated heating and cooling cycles, the repeated change in pressure differential causes the walls of the container to flex. Eventually, the container fatigues, causing small leaks. When a leak does occur, air is drawn into the container. Later on, when the component is then reactivated, the presence of air increases the pressure inside the container and may cause some of the liquid to be driven out of the container, thereby compromising the cooling capability of the device. Consequently, such devices are typically not considered to be useful in environments where long-term low-maintenance operation is required.

Furthermore, the change in internal pressure results in a further increase in the coolant boiling point, which may also be altered by the presence of any residual air introduced into the system by leaks. Such devices thus cannot be expected to have a single predictable boiling temperature, and are therefore difficult to control over a wide temperature range.

Prior art two-phase systems are also prone to a phenomenon called overshoot. This occurs during device warmup as a result of the fact that the coolant does not begin to boil when the device temperature initially reaches the nominal boiling point. Instead, the tendency is for the temperature to continue to increase past the boiling point, and then for boiling to suddenly erupt. Once coolant boiling finally does occur, the device temperature returns to its normal operating range. However, in the meantime, the system has been temporarily subjected to a temperature well above the boiling point. Overshoot is a highly undesirable condition as it stresses the cooling system components and in some cases may even cause the components to temporarily operate outside their expected temperature range.

What is needed is a cooling device which will adequately cool current-day high-powered integrated circuits in a compact, reliable package, which avoids the problems associated with prior art systems.

Specifically, the cooling device should have a heat transfer rate higher than the heat transfer rates available with known single-phase systems, without requiring that the heat-dissipating component be immersed in a coolant liquid. Furthermore, the cooling device should not exhibit the problems of present day two-phase systems, but rather should be immune to leaking, have a predictable boiling point, and avoid overshoot.

SUMMARY OF THE INVENTION

Briefly, the inventive liquid cooling device comprises a sealed bag or other closed container formed of a flexible material which is impermeable to both air and liquid coolant. A portion of the bag is disposed adjacent to the heat-dissipating component and the interior of the bag is partially filled with a liquid coolant having a boiling point below the normal maximum operating temperature of the heat-dissipating component. Because the bag is only partially filled with coolant, the system cycles in two-phase operation, with the coolant alternately vaporizing at the bag portion adjacent to the component and condensing at bag portions distant from the component. The portion of the bag which is not filled with coolant is filled with coolant vapor and non-condensing gas and the bag is sufficiently flexible such that the interior bag pressure remains substantially at the ambient environmental pressure both at ambient temperature and over the entire operating temperature range.

In accordance with one preferred arrangement, the flexible bag is made from a material which has a sufficient film strength and a sufficiently high melting point to withstand the normal operating pressures and temperatures produced by the heat-dissipating component. One illustrative material suitable for use with the preferred arrangement is a laminate with a central aluminum layer to act as a vapor barrier, one more outer layers formed of a polyester to provide film strength, structural rigidity, and abrasion resistance, and an inner layer formed of a composite polypropylene for heat sealing. Such laminates, known as Meals Ready to Eat (MRE) materials are well known in the food packaging industry.

Preferably, the liquid coolant disposed within the bag is a thermally-stable, environmentally-safe fluorochemical with a boiling point at atmospheric pressure in the vicinity of 60° C. which is well below the maximum operating temperature of 80°–90° C. of most commercial-grade electronic components.

In accordance with another embodiment, a heat spreader plate is preferably disposed between the interior of the bag and the heat-dissipating component, which heat spreader plate acts as a thermal via between the coolant and the heat-dissipating component. Since it is a primary surface for transfer of heat from the heat-dissipating component to the coolant, the heat spreader plate provides a stable, predictable surface at which the phase change from liquid to vapor will take place within the cooling system and, in accordance with another embodiment of the invention, the plate is treated to provide nucleation sites to enhance this boiling.

The heat spreader plate is formed of material having high thermal conductivity, such as aluminum, and extends through the wall of the bag. Accordingly, the heat spreader plate has a first portion outside the bag which thermally contacts the heat-dissipating component and a second portion inside the bag which thermally contacts the coolant liquid. The bag may be sealed around the edges of the heat spreader plate by means of O-ring or other compression seals, but, in accordance with another embodiment, the heat spreader plate is first treated to allow the bag material to be directly bonded to the spreader plate.

DETAILED DESCRIPTION OF THE PREFERRED EMBODIMENTS

Figure 1B:
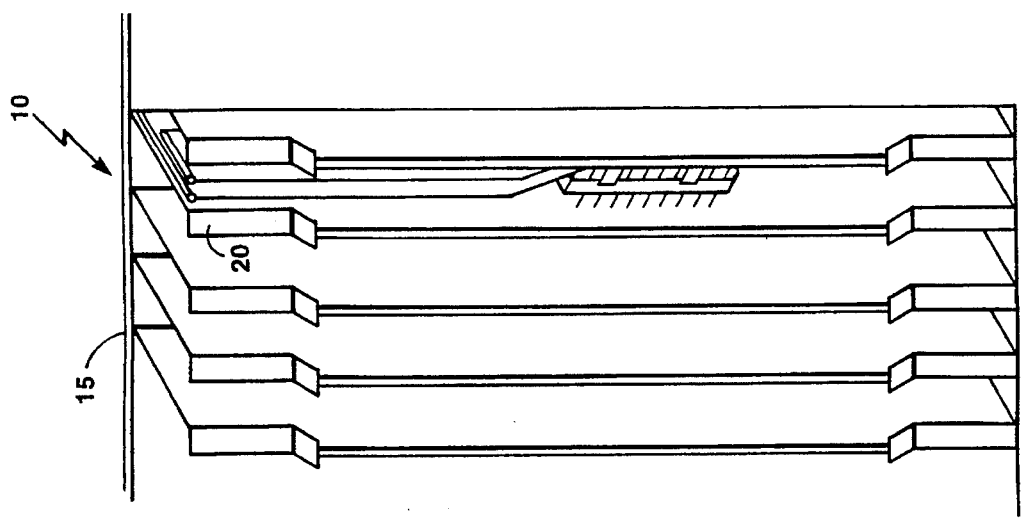
FIG. 1B is an isometric view of the inventive cooling apparatus inserted into an enclosure which holds the apparatus in a vertical orientation.
Figure 1A:
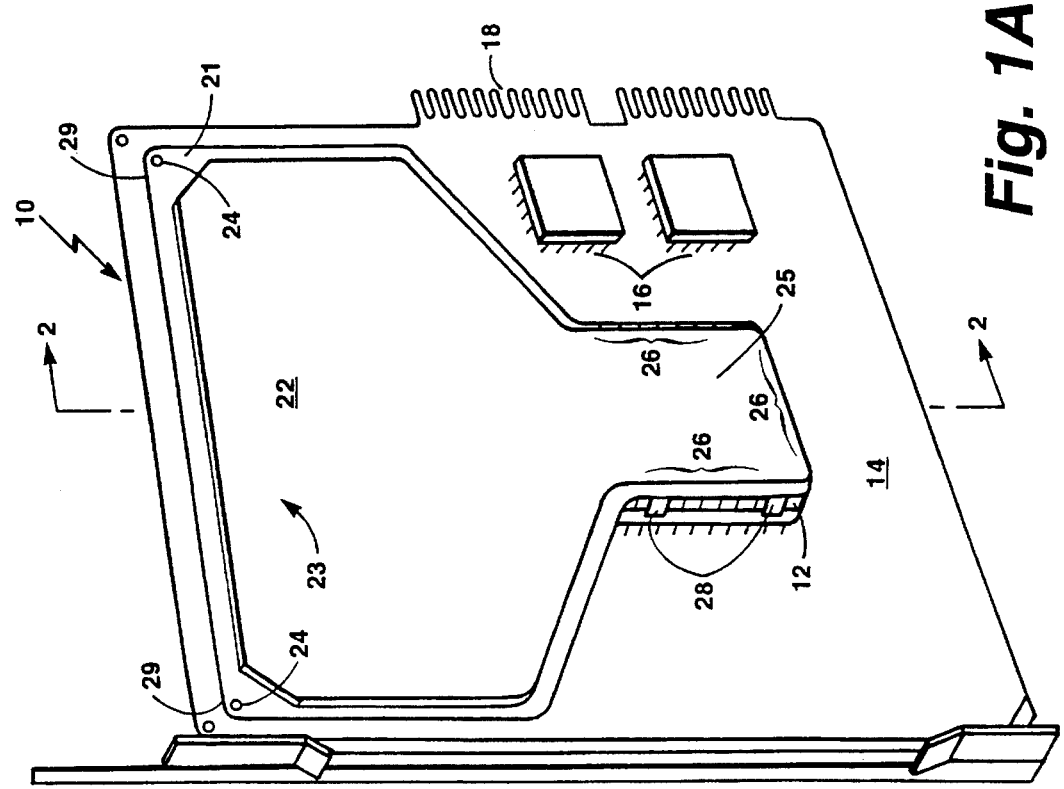
FIG. 1A is an isometric view of a liquid cooling apparatus constructed in accordance with the principles of the invention.

FIG. 1A illustrates a heat transfer apparatus 10 for cooling an electronic component such as an integrated circuit or chip package 12. The integrated circuit package 12 is mounted on a circuit board 14 of the type that is commonly used in computer and other electronic systems.

Integrated circuit package 12 is a relatively high-powered component which may dissipate 10 watts or more and which itself may contain many hundreds of thousands of active electronic devices. Most commonly, the integrated circuit package 12 is a microprocessor chip or other such highly-sophisticated component, but may also consist of several integrated circuits mounted on a heat spreader plate as will hereinafter be described. In addition, the integrated circuit package may be a multi-chip module having more than one chip within a single ceramic or plastic package.

Components 16 other than the integrated circuit package 12 are also typically mounted on the circuit board 14. For clarity, FIG. 1A does not show that many additional integrated circuit chips are normally included on the circuit board 14. The circuit board 14 includes connectors 18 enabling the integrated circuit package 12 and other components 16 to communicate with circuits on other circuit boards.

The circuit board 14 is intended to be mounted in a vertically-oriented position in a circuit board enclosure 15, as shown generally in FIG. 1B, and the circuit board 14 is typically inserted and extracted from the enclosure 15 using levers 20.

Returning to FIG. 1A, the heat transfer apparatus 10 according to the invention will be described more particularly. The invention comprises a flexible, sealed bag 22 which is shaped to conform to the available space on the circuit board 14 above the integrated circuit package 12, while at the same time having a low enough profile so as not to interfere with adjacent circuit boards 14 when installed in the enclosure 15 (FIG. 1B). In addition, the bag 22 is shaped so that vapor which is generated in the lower evaporator portion 25 of the bag 22 condenses in the upper condenser portion 23 and returns to the evaporator portion 25 by gravity.

The bag 22 is typically manufactured separately from the integrated circuit chip 12, and is formed of a flexible sheet material which is impermeable to air, other gases, and liquids. The material may be a single or multi-layer plastic film and is usually a type of thermoplastic film, because the latter is readily available and is often heat-sealable. The preferred material for the bag 22 is a multi-layer film formed of a thin aluminum or other metallic layer laminated on both sides with one or more layers of a modified polyester terphthalate (PET) film and is held together with a laminating adhesive on one side, and polypropylene film on the other side. One example or such a multi-layered film is sold as Meals Ready to Eat (MRE) type film by the American National Can Company of Mt. Vernon, Ohio. The bag can also be made of any other similar material which can withstand the normal operating temperature of the components, typically 70–110 degrees centigrade (°C). The sheet material should be sufficiently flexible that the internal pressure in the bag interior remains at, or near, the ambient environmental pressure over the entire operating temperature range to which the bag is exposed. Since the internal bag pressure changes little during operation, the coolant boils at, or very near, its boiling point at ambient pressure. Thus, the device 10 does not have the extended temperature ranges which characterize the prior art devices.

The bag 22 is attached to the circuit board 14 and to the integrated circuit package 12. To permit attachment of the bag 22 to the circuit board 14, the periphery 21 of the bag 22 is formed more rigidly than the center, and includes holes 24 adapted to receive fasteners such as screws or the like which hold the periphery 21 of the bag 22 against standoffs 29. The rigid periphery 21 of the bag 22 may be formed by heat-sealing the two layers of the plastic film together to form a rigid lip or by heat-sealing or attaching the plastic film layers to a third more rigid frame.

The peripheral portions 26 of the bag adjacent the chip 12 are also somewhat rigid and adapted and/or shaped to be held in position against the integrated circuit package 12 with one or more clips 28. The clips hold the lower side of the bag 22 against the outer surface of the package 12 in a manner that will be described in greater detail below.

Figure 2A:
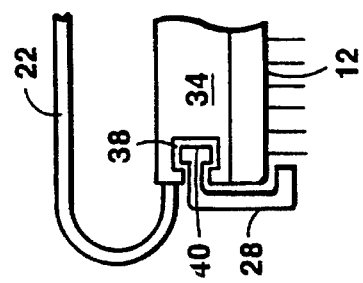
FIG. 2A is a cross-sectional view showing in detail a clip for holding the cooling apparatus in place against a heat-dissipating component.
Figure 2:
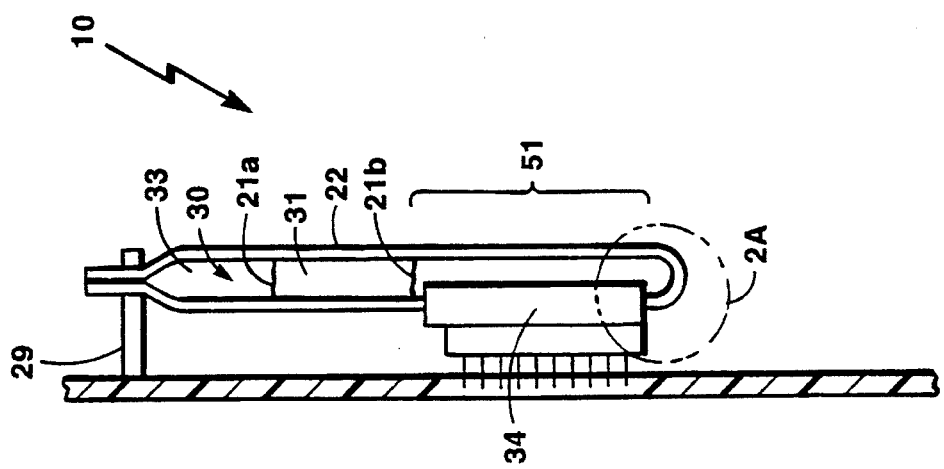
FIG. 2 is a cross-sectional view of the cooling apparatus shown in FIGS. 1A and 1B taken along section line 2—2 shown in FIG. 1A.

As shown in the cross-sectional view of FIG. 2, the interior 30 of the bag 22 is partially filled by a quantity of liquid coolant 31. In particular, as indicated by level line 21a, the liquid 31 typically occupies from 75 to 90 percent of the bag interior 30 when the bag is in storage, i.e., at room temperature. The bag 22 must only be partially filled with coolant, so that two-phase operation occurs, as described below. However, the bag should be filled with enough coolant so that at least a portion of the heat spreader 34 is always immersed in liquid during operation. Thus, even at the maximum operating temperature of the condenser (e.g., when a maximum amount of coolant is in the gas phase), the liquid level is approximately as shown by level line 21b.

The coolant liquid 31 preferably comprises a liquid (at the ambient environmental temperature) which is thermally conductive, chemically inert, non-toxic, non-ozone-depleting, and thermally stable, and which is also preferably electrically non-conductive to prevent short circuiting of external electronic components should the bag 22 be ruptured for any reason. The thermal stability of the liquid 31 enables it to maintain its physical and chemical properties throughout repetitive thermal cycles of the integrated circuit package 12 during normal use.

Preferred liquids include the well-known Fluorinert™ electronic fluids which are commercially available from the Minnesota Mining and Manufacturing Company of St. Paul, Minn. (Fluorinert is a trademark of the Minnesota Mining and Manufacturing Company of St. Paul, Minn.). A coolant liquid which is particularly suitable for use with the invention is Fluorinert™ FC-72 liquid, which has a relatively low boiling point of approximately 56 degrees Centigrade (°C). The boiling point of FC-72 is thus well below the maximum operating temperature range specified of 80°–90° C. for the typical integrated circuit package 12. Other coolants 31 which are suitable for use with the invention includes, but is not limited to methylene chloride, ethyl alcohol, methanol, and other chemicals, as long as they exhibit a predictable boiling point over a range of operating temperatures.

Contrary to prior art designs, the bag 22 is not purged of residual gases during manufacture. Instead, residual, non-condensing gases, such as air, are sealed within the system in order to promote boiling, in a manner that is described in detail below.

As temperature inside the bag 22 increases, because the bag 22 is formed of a flexible material, the amount of gas inside the bag is not affected by the ambient pressure. The bag 22 is thus less prone to the long term leaking problems associated with certain other prior art devices in which the bag or other container is evacuated of such gases or completely filled with coolant 31. In addition, as explained below, the residual gases dissolve in the coolant liquid 31 and assist in initiating boiling.

The process of boiling is of particular concern to the present invention, because, unlike prior art arrangements using similar bags, a cooling system constructed in accordance with the principles of the present invention requires that the liquid 31 enter a vapor state when the temperature of the integrated circuit package 12 rises to a predetermined temperature.

More particularly, as heat is dissipated by the integrated circuit package 12, the temperature of the coolant 31 approaches the boiling point. Once boiling begins, thermal transfer is enhanced (as compared to convection) since the coolant phase change requires that increased amounts of heat be transferred to the coolant. The transferred heat energy is, in turn, transported in the form of coolant vapor into a space 33 formed above the liquid level 21a, 21b. The vapor in the space 33 then eventually condenses along the upper walls of the bag 22 and returns to a liquid state, where it drops back down the pool of liquid 31 by the force of gravity. The coolant thus experiences repeated phase changes.

Sufficient residual gas is maintained in the system so that some of the gas dissolves in the liquid coolant 31 when the device is not operating and is at ambient temperature. During warmup, the residual gas comes out of solution and creates nucleation sites that assist in initiating boiling and thus minimize the aforementioned "overshoot" phenomenon.

As shown in FIG. 2, bag 22 may not be directly attached to a plastic integrated circuit 12. Rather, a heat spreader plate 34 can be positioned to contact the integrated circuit package 12 substantially along one of the major outer surfaces thereof. Spreader plate 34 can be manufactured as an integral part of the integrated circuit 12 package or manufactured separately. Alternatively, one or more individual integrated circuit devices can be mounted directly on the heat spreader plate 34 opposite the bag 22.

The heat spreader plate 34 extends through a hole in the bag 22, and provides a high thermal conductivity heat transfer path or via directly between the integrated circuit package 12 and the coolant 31. As such, the transfer of heat into the coolant 31 is not hindered by any thermal resistance of the bag 22 in areas adjacent the integrated circuit package 12. Moreover, since only the heat spreader plate 34, and not the outer surface of the integrated circuit package 12 contacts the coolant 31, the integrated circuit package 12 need not be compatible with long term exposure to the coolant fluids used within the bag 22.

The heat spreader plate 34 is typically made of a material having high heat conductivity such as copper, diamond-copper composite, aluminum, or, in some cases, high-conductivity plastic.

Additional nucleation sites to enhance coolant boiling may be provided on the surface of the heat spreader plate 34 by specially treating the inner surface of the heat spreader plate 34 (i.e., the surface exposed to the liquid) to provide a pitted surface. If the pits are of suitable size and shape, they will provide nucleation sites which ensure that the coolant 31 boils substantially at its boiling point.

The heat spreader plate 34 may be mounted to the integrated circuit package 12 using epoxy, solder, cement, compression seals, thermal grease or other arrangements, and may be held in place against the chip 12 using contact springs or clips 28, as previously described. FIG. 2A is a more detailed view of a preferred C-shaped clip 28, as arranged to hold the bag 22, heat spreader 34 and package 12 together. A T-shaped channel 38 is formed in the outer periphery of the lower portion of the spreader plate 34, and is adapted to receive the clip 28, which in turn has a T-shaped end 40 adapted to fit into the channel 38. The clip 28 is thereby fastened to the plate 34 and fits over the lower edge of the chip package 12, holding the assembly against the surface of chip package 12.

Figure 3:
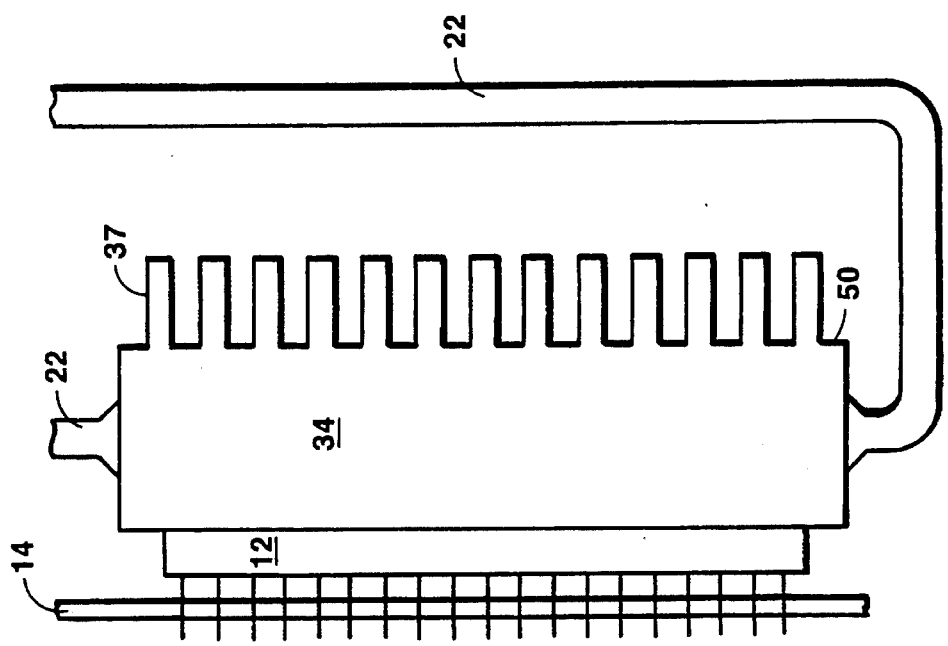
FIG. 3 is a cross-sectional view of an alternative embodiment of a heat spreader plate for use with the present invention making use of fins to provide greater surface area for heat transfer.

The heat spreader plate 34 may be smooth or flat for cooling relatively lower power components. However pin fins or tab (continuous) fins may be formed in the heat spreader plate 34 to help draw the coolant into the hottest areas of the spreader plate 34. For example, in the design shown in FIG. 3, heat spreader plate 34 has pin fins 37 formed thereon on an inner surface 50 which faces into the bag interior. In such an application, of course, the bag 22 might have a larger cross dimension in order to accommodate the pins 37.

Figure 4:
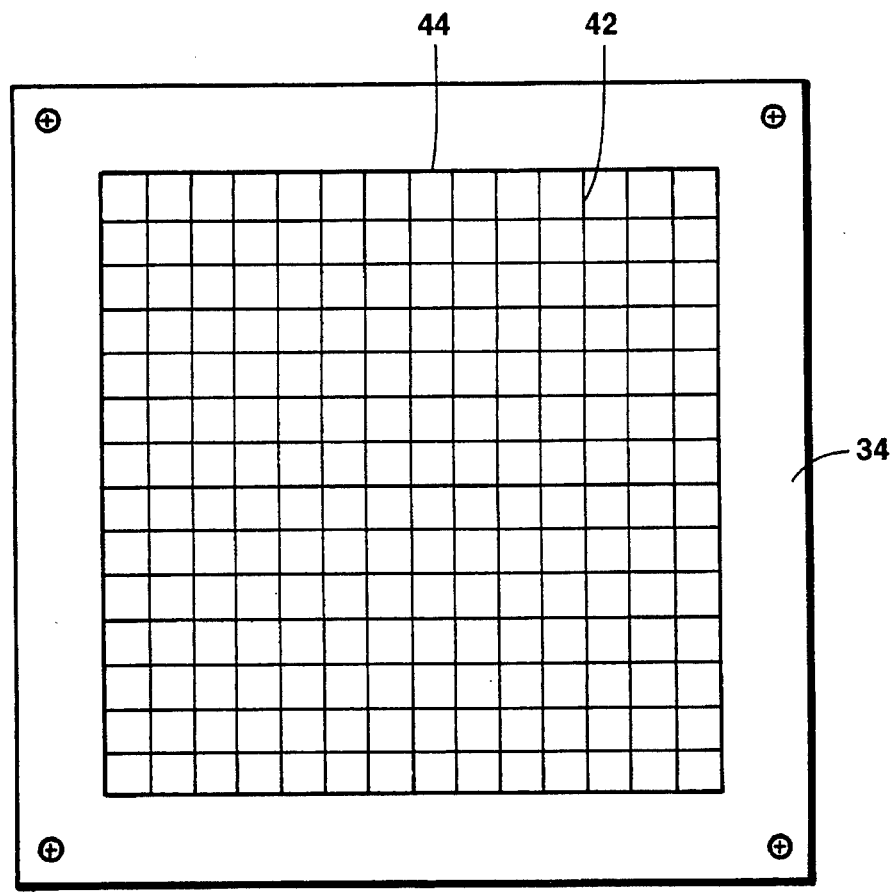
FIG. 4 is a top plan view of a heat spreader plate.

Another possibility is to provide a spreader plate as shown in FIG. 4. In that arrangement, a raised portion 44 of the plate 34 extends into the fluid 31, and may have slots 42 cut into it. This further increases the surface area and makes additional sites available for boiling. The sizes of the slots 42 are chosen to optimize bubble formation and coolant return.

Returning attention briefly to FIG. 2, the bag 22 is attached in a suitable manner, such as, preferably by heat-sealed directly to the heat spreader plate 34. To insure a reliable heat seal, the heat spreader plate 34 may be specially treated before heat-sealing is performed. In accordance with another embodiment of the invention, the heat spreader plate 34 is formed of aluminum. The aluminum is treated by a conventional anodizing process. However, after the spreader plate 34 has been anodized, the nickel acetate or other sealing solution that is typically applied to seal the anodized surface is not applied. The unsealed, anodized aluminum plate 34 thus provides a porous surface for better adherence of the bag 22 with small cracks and other irregularities in the surface providing sites for the melted thermoplastic to adhere. The porous surface presented by the anodized aluminum also provides additional nucleation sites to further assist in encouraging boiling at an early stage.

Instead of heat-sealing the bag 22 to the plate 34, conventional O-ring arrangements may also be used to hold the bag 22 in compression seal against the surface of the heat spreader plate 34.

In another embodiment, the aluminum surface may be treated with an organic solvent primer such as that sold under the trademark Morprime 10-B, by Morton International, Inc. of Chicago, Ill.. Such primers provide good adhesion for the polypropylene bag material.

The heat spreader plate 34 may also be formed of sintered metal. It has been found that if the sintered metal parts are compacted to approximately 60%–70% density to produce an average pore size on the order of 100 microns, the pores will produce additional nucleation sites to encourage early boiling and discourage overshoot.

Figure 5:
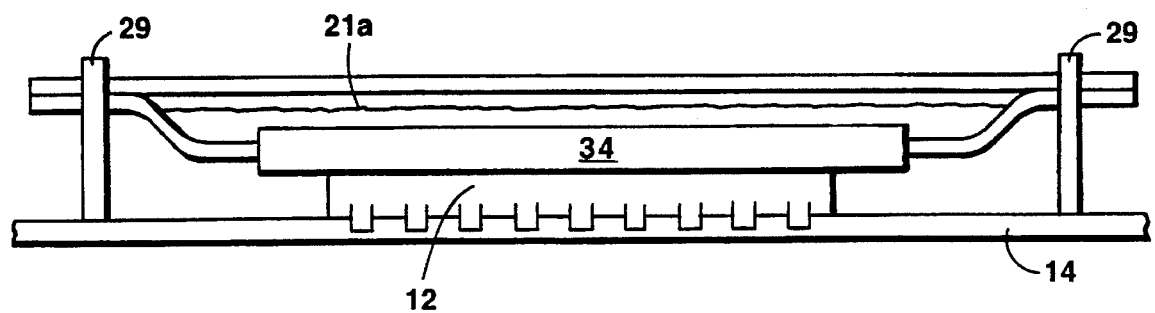
FIG. 5 is an alternative arrangement showing the bag disposed in a horizontal orientation.

Other orientations of the bag 21 are also possible. For example, instead of being clipped to package 12, the bag 22 may be mounted over package 12 by placing standoffs 29 on both sides of the package 12. This embodiment, as shown cross section in FIG. 5, is of particular use in applications where the printed circuit board 14 cannot be guaranteed to be placed in a vertical orientation, such as in laptop or desktop computers. In this embodiment, the bag 22 is simply pressed in position over the integrated circuit package 12.

Figure 6:
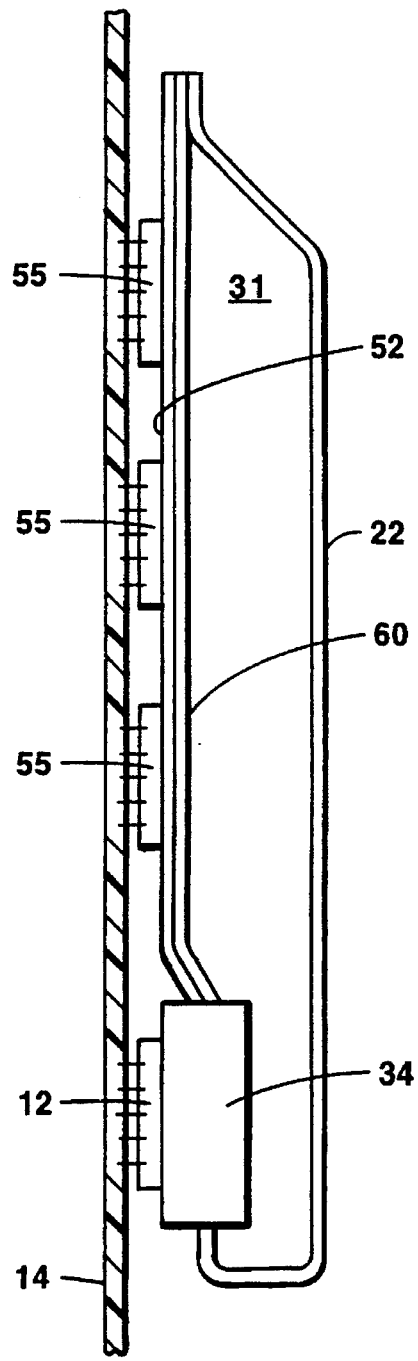
FIG. 6 is a cross-sectional view showing integrated circuit chips disposed underneath the bag.

In general, wicking is typically not required to reliably return the condensed coolant to the liquid coolant pool, and that gravity can usually be relied upon for this purpose. However, there can be certain instances, as shown in FIG. 6, in which wicking material 60 may be provided inside the bag 22 along the interior bag surfaces, with certain advantages. Such an arrangement is particularly convenient in arrangements where the outer surface 52 of the bag 22 contacts additional heat-dissipating components 55 which may be mounted on the circuit board 14 beneath the bag 22. The wick 60 can typically be provided as a polyester or polypropylene woven fabric, or as a metal screen.

When present, the wick 60 pulls liquid coolant by capillary action up along the upper surfaces of the bag 22 adjacent the additional chips 55 which may need some cooling but not quite as much cooling as the primary chip package 12.

However, when a wick is used the coolant preferably has a high surface tension. The aforementioned preferred Fluorinert™ material has a very low surface tension, and does not wick particularly well, so that other cooling fluids such as water, methanol, or acetone are preferred in this application.

Figure 7A:
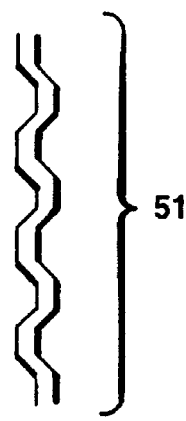
FIGS. 7A, 7B, and 7C are cross-sectional and top views of a pleated portion of the bag.
Figure 7B:
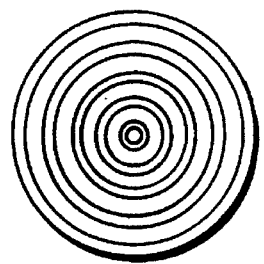
Figure 7C:
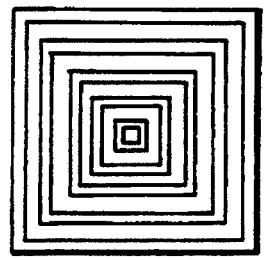

It has been found that over time, depending upon the material chosen for the bag 22, that the bag 22 may tend to sag under the force of gravity, so that the interior area of the bag 22 adjacent the spreader 34 may increase, causing the minimum coolant level 21b to decrease (FIG. 2). Thus, it is desirable in some instances to pre-form pleats in the bag 22, as shown in the cross sectional view of FIG. 7A, to minimize the effects of such sagging. The pleats, which act as structural stiffeners, may be circular or square in shape, as shown in FIG. 7B and 7C respectively, or may be of other shapes.

Heat sealed dimples may also be used to physically attach the film to the heat spreader 34 to prevent sagging.

There are several advantages of this invention which will now be understood by those of skill in the art. For example, the single bag 22 provides two-phase cooling, without the need for a separate condenser and evaporator unit, tubes or other interconnecting apparatus. In addition, the cooling system 10 does not require fans, blowers or other noise generating components and thus is ideal for use in applications where noise is of prime consideration such as offices and the like. Further, the bag 22 has a low profile, and is lighter than the usual metal heat sinks associated with large integrated circuit chips 12. Finally, the use of the polypropylene bag 22 in connection with an anodized aluminum heat transfer plate 34 provides good and reliable heat seal connection, thereby providing an enclosure space 30 which is predictably free from leaks and other failures, and thus requires no maintenance over the long term.

The advantages of two-phase cooling are provided in an arrangement in which single-phase cooling has heretofore only thought been possible. The invention is adaptable to a wide variety of devices including laptop computers, server computers and other applications in which quiet, inexpensive and reliable cooling of integrated circuit chips is important. For example, a cooling system built in accordance with the principles of the invention in the manner shown in FIGS. 1A and 1B has been found sufficient to cool a 42 watt chip package 12 to a temperature of 57 degrees centigrade which is far below the 70 degree mean operating temperature specified for the Pentium™ chip by Intel Corporation.

The terms and expressions which have been employed above are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method for fabricating a cooling apparatus comprising a closed bag having at least one wall of flexible, thermoplastic sheet material with a hole therein, the hole having a periphery, and an aluminum plate having a surface, the method comprising the steps of:

A. anodizing without sealing the aluminum plate surface to produce a porous anodized plate surface; and B. adhering the sheet material at the hole periphery to the porous anodized plate surface to produce a sealed bag.

2. A method as in claim 1 wherein step B comprises the step of:

B1. heat sealing the hole periphery to the porous anodized plate surface.

3. A method as in claim 1 wherein step B comprises the step of:

B2. adhering the hole periphery to the porous anodized plate surface with an adhesive adapted for adhering thermoplastic material to aluminum.

4. A method as in claim 1 wherein step B comprises the steps of;

B3. priming the aluminum plate with Morprime 10-B, and

B4. anodizing the primed plate.

5. A method for fabricating a cooling apparatus according to claim 1 wherein step A comprises the steps of:

A1. selecting a first sheet and a second sheet of a multi-layer laminated material, each of the first and second sheets of laminated material having a periphery; and A2. heat-sealing the peripheries of the first and second sheets of laminated material together to form the bag.

6. A method for fabricating a cooling apparatus comprising the steps of:

A. fabricating a closed bag having at least one wall of flexible, thermoplastic sheet material with a hole therein, the hole having a periphery;

B. fabricating a bare aluminum plate having a sealing surface;

C. anodizing the aluminum plate sealing surface to produce a porous anodized plate sealing surface;

D. positioning the porous anodized plate sealing surface in contact with thermoplastic sheet material at the hole periphery; and E. adhering the thermoplastic sheet material at the hole periphery to the porous anodized plate sealing surface.

7. A method for fabricating a cooling apparatus according to claim 6 wherein step B comprises the step of:

B1. fabricating the aluminum plate with tinned surfaces located at areas apart from the sealing surface.

* * * * *